United States Patent [19]
Faulk

[11] Patent Number: 5,694,302
[45] Date of Patent: Dec. 2, 1997

[54] PASSIVE CLAMP AND RIPPLE CONTROL FOR BUCK BOOST CONVERTER

[75] Inventor: Richard A. Faulk, Cypress, Tex.

[73] Assignee: Compaq Computer Corporation, Houston, Tex.

[21] Appl. No.: 699,990

[22] Filed: Aug. 20, 1996

[51] Int. Cl.$^6$ .......................... H02M 3/335; G05F 1/253
[52] U.S. Cl. ................ 363/16; 323/262; 363/45
[58] Field of Search ...................... 323/262, 282; 363/16, 21, 45, 56, 124; 361/84; 327/478

[56] References Cited

U.S. PATENT DOCUMENTS

| | | |
|---|---|---|
| 4,184,197 | 1/1980 | Cuk et al. |
| 4,186,437 | 1/1980 | Cuk. |
| 4,257,087 | 3/1981 | Cuk. |
| 4,274,133 | 6/1981 | Cuk et al. |
| 4,355,352 | 10/1982 | Bloom et al. ........................ 363/16 |
| 4,772,810 | 9/1988 | Felps ............................... 327/478 |
| 5,442,539 | 8/1995 | Cuk et al. ........................ 363/16 |
| 5,570,276 | 10/1996 | Cuk et al. ........................ 363/16 |

OTHER PUBLICATIONS

J. Scot Finnie, Extend Your Laptop's Battery Life, PC–Computing, vol. 5, No. 4, p. 174(5), Apr. 1992
T. J. Byers, Smart Software Extend Battery Life, PC World, vol. 10, No. 9, p. 120(1), Sep. 1992.
John Gallant, Power Management, EDN, vol. 37, No. 21, p. 114(7), Oct. 15, 1992.
Lloyd Dixon, High Power Factor Preregulator Using the SEPIC Converter., Unitrode Seminar, May 1983.
Jeffrey Child, Special Report: The Next–Generation PCs: Making every watt Count, Computer Design, vol. 32, No. 12, p. 57(6), Dec. 1993.
K. H. R. Weber, Das Ersatzschaltbild mehrerer gekoppelter Induktivitaten und die Streuresonanz beim Dreiwiklungsubertrager (Mitteilung aus dem VEB Funkwerk Kopenick), Nachrichtentechnik—8 (1958) H.7, pp. 290–297.

Sam Weber, Part 1: Mobile Computing: Computer Design, Electronic Engineering Times, No. 889, p. 37(5), Feb. 19, 1996.
Keith H. Billings, Switchmode Power Supply Handbook, Sec. 8.5, p. 2.67, 1989.
Abraham I. Pressman, Switching Power Supply Design, Sec. 11.7, pp. 422–425, 1991.

*Primary Examiner*—Stuart N. Hecker
*Attorney, Agent, or Firm*—Robert Groover; Betty Formby; Matthew S. Anderson

[57] ABSTRACT

A power conversion circuit, in which a flyback converter is modified with additional elements to provide both dissipationless snubbing and also input ripple cancellation. This is achieved by appropriate connection of an additional winding to the isolating transformer, without any need for a second transformer. The configuration of the secondary is conventional, and the switching transistor is connected in series with the primary winding across DC inputs (taken e.g. from a full-wave-rectified line voltage). The additional winding is connected on the primary side, and preferably has a near-unity turns ratio with the primary which is the inverse of the coupling coefficient. However, the additional winding is not connected between the two DC inputs, but instead has one end coupled through an intermediate capacitor to the corresponding end of the primary, and the other end coupled through a capacitor to the negative DC input. By use of appropriate reactances a balancing current is maintained in the additional winding, which keeps the total current through the primary absolutely flat. The intermediate capacitor which links the primary and additional windings also provides efficient snubbing: it catches the energy stored in the primary leakage inductance, and also limits the maximum voltage on the switch. This results in a converter with no ripple at the input, high efficiency, and very efficient snubbing. Moreover, by using a second active element for regeneration, energy loss during switching of the primary switch is minimized.

61 Claims, 5 Drawing Sheets

5,694,302

PASSIVE CLAMP AND RIPPLE CONTROL FOR BUCK BOOST CONVERTER

BACKGROUND AND SUMMARY OF THE INVENTION

The present invention relates to power converters, and particularly to "off-line" converters, i.e. power converters which are operated from an AC power-line (mains) supply.

Background: Flyback Converter Topology

Buck-Boost or "flyback" converters are a class of power converter topology which is common in off-line adapters. In this configuration, as shown in FIG. 1A, a switching transistor Q switches the primary $L_P$ of a transformer TR. Each of the secondary windings $L_S$ of the transformer is connected through a diode $D_F$ (the "flyback" diode) to an output capacitor $C_{out}$. Thus, while the switching transistor is on the current through the primary increases (storing energy in the transformer), and when the switch is opened, the stored energy is discharged at the transformer secondary through the flyback diode. Feedback is provided through error amplifier EA and pulse-width modulation circuit PWM. Of course the duty cycle and the turns ratio of the transformer can be chosen to provide the desired output voltage range.

Background: Snubber Networks

One of the primary design considerations in switch-mode power supplies is control of the operating conditions of switching transistors. While FET transistors are available with amply high voltage ratings, a higher-voltage-rated transistor tends to have a higher on-resistance than a lower-voltage-rated transistor. Moreover, selection of higher voltage ratings than necessary may increase the cost of the design. However, the presence of substantial inductances may mean that the voltage actually seen by the transistors may be substantially higher than the DC input voltage. Stress on the switching transistor is particularly high in flyback and analogous topologies, which are often used for direct-off-line converters.

Another problem in isolated power converter circuits is that any transformer includes a leakage inductance which is a source of energy loss. In a transformer circuit model, this parasitic inductance appears as a discrete inductance in series with the transformer primary. This leakage inductance can be a source of inefficiency; in flyback-type converters, for example, the energy stored in this inductance during current ramp up is not transferred through the transformer, and thus is not recovered during the discharge phase. It would be desirable to recover the energy stored in this leakage inductance.

Another source of inefficiency is the parasitic capacitance of the switch. Because of this capacitance, the switch will still hold a voltage when turned off, and hence the energy stored on this parasitic capacitor provides a possible path for energy loss.

To reduce the risk of high voltage breakdown on the switch, and to reduce power loss due to parasitics, it is common to add a snubber capacitor $C_S$ parallel to the FET switch Q. See generally the chapter which starts at page 1.134, and also the chapter which starts at page 2.32, of Billings' SWITCH MODE POWER SUPPLY HANDBOOK, which is hereby incorporated by reference. Snubber networks not only reduce voltage stress, but also can serve to reduce electromagnetic interference (EMI) generated by switching of the power device. FIG. 1B shows a simple snubber configuration of this type, which is referred to as an "RCD" snubber. Since the capacitor $C_S$ itself needs protection, a bleed resistor $R_B$ is commonly added to protect this capacitor. A diode $D_S$ in parallel with the bleed resistor avoids IR voltage rise while the capacitor is catching the current at turn-off.

In this configuration the capacitor stores the energy which was built up in the leakage inductance. (The energy stored in the remainder of the primary inductance will be coupled through the secondary as desired, and therefore does not present a problem.) Every real transformer also includes a leakage inductance, and the energy in this leakage inductance cannot be dissipated through the secondary. Thus, an ideal transistor which instantaneously interrupted current through a transformer primary would face a very sharp voltage spike (limited only by parasitic capacitance and breakdown voltages), due to the energy stored in the leakage inductance. The resistor is used to dissipate the energy stored in the capacitor during the off-phase of the switching transistor.

Background literature regarding snubber circuits is found in the following publications, all of which are hereby incorporated by reference: Whitcomb, "Designing Non-Dissipative Current Snubbers for Switched Mode Converters," 6 *Powercon Proceedings* (1979); Shaunessy, "Modeling and Design of Non-Dissipative LC Snubber Networks," 7 *Powercon Proceedings* (1980); Meares, "Improved Non-Dissipative Snubbers for Buck Regulators and Current Fed Inverters," 9 *Powercon Proceedings* (1982); Domb et al., "Non-Dissipative Turn Off Snubber Alleviates Switching Power Dissipation, Second Breakdown Stress," 1982 *PESC Record*; Ninomiya et al., "Optimum Design of Non-Dissipative Snubber by Evaluation of Transistor's Switching Loss," 1985 *PESC Record*; Tanaka et al., "Design of a Non Dissipative Snubber in a Forward Converter," 1988 *PESC Record*.

Background: Active and Dissipationless Snubbers

An RCD snubber still provides power dissipation, since the energy stored in the leakage inductance in each half cycle is eventually dissipated in the resistor. Moreover, the switching transistor normally has enough capacitance to maintain the applied voltage when it is turned off. Thus, energy is stored in the switching transistor, and this energy (if not recovered) will be a component of power dissipation.

Therefore, substantial efforts have been made to provide non-dissipative snubber circuits. One approach to provide a non-dissipative snubber is to shunt the switch with a capacitor-diode series combination, in which a second active switch is used to short-circuit the diode during the off-cycle. Thus this capacitor will drive against the inductor during the off-cycle. This circuit solves the problem of energy storage in the main switch, and avoids dissipation. However this circuit requires an additional transistor, and therefore is not economical.

Thus it would be desirable to provide a non-dissipative snubber without using an additional active element. One previous approach to do this has been to use an additional transformer winding. FIG. 1C shows a partially non-dissipative snubber circuit using an additional transformer $T_{ADD}$ in addition to an RCD snubber. See also page 2.67 of the Billings handbook, which describes the use of an "energy recovery winding" to assist in clamping.

Background: Current Steering Effects in Transformers

Consider now a simple transformer circuit, as shown in FIG. 2A, wherein the primary and secondary windings of an ideal transformer $TR_I$ are coupled together at one end, and are driven at their other ends by two nearly equal voltage sources $V_1$ and $V_2$. If one of these voltage sources is slightly greater than the other, then the lower-voltage side will divert all current from the higher-voltage side, so that (surprisingly) the higher-voltage side will conduct no current at all.

By transforming this circuit, it can be mathematically modelled as an equivalent T-circuit. FIG. 2B shows a circuit model which is equivalent to the circuit shown in FIG. 2A. (Note that this T-configuration may include a negative inductance, so this represents a mathematically useful model rather than physical reality.) In this equivalent circuit, the value of the top left (series) inductance $L_A$ will be $(n^2-nk)L_2$, the value of the top right (series) inductance $L_B$ will be $(1-nk)L_2$, and the value of the central (shunt) inductor $L_C$ will be $nkL_2$, where k is the coupling coefficient and n is the apparent turns ratio. (The apparent turns ratio is the actual voltage ratio seen, as adjusted for the effects of the leakage inductance and the magnetizing inductance of the transformer primaries.)

If nk=1, then the circuit of FIG. 2B can be further simplified as shown in FIG. 2C. This reduced version of the circuit model of FIG. 2B, which has only two inductances, is valid under the special condition that nk=1. This reduced version is particularly interesting because, if equal AC voltages are placed on left and right sides of the circuit, no current will flow through the $(n^2-nk)L_2$ inductance ($L_C$).

A similar simplification can be made under the special condition that n=k. In this case the upper left inductance $L_A$ of FIG. 2B goes to 0, and a similar ripple-steering effect can be achieved.

Background: Ripple-Free Converter Topologies

One of the important design parameters for switching power supplies is the presence of ripple. Different applications have different degrees of tolerance to voltage fluctuations caused by the active switching which occurs in the power supply itself, and some applications may have very low tolerance for this. Therefore, one of the parameters to be controlled for in at least some converter topologies is the degree of ripple present on the output. Output filters are typically used to reduce ripple, but lower ripple before filtration permits the achievement of either a lowered ripple in the filtered signal or reduction in the size of the discrete components necessary for adequate output filtering.

It is also desirable to reduce ripple on the input to zero. High frequency variation in the input current can propagate into other components, or introduce unacceptable noise coupling pathways into the total system environment.

In most switching power supplies, the switching transistors provide a powerful source of noise at the switching frequency (and its harmonics). However, two converter topologies (the SEPIC and Ćuk converter topologies) both exploit the steering effects discussed above (in connection with FIGS. 2A–2C) to achieve ripple cancellation.

The isolated Ćuk converter, as shown in FIG. 2D, provides efficient cancellation of ripple currents. This is achieved by using a second transformer $TR_2$ (with nk=1, or with n=k), in addition to the main transformer TR, to provide a ripple-cancelling contribution. Since this topology requires two separate magnetic elements, the volume and cost of the power supply are increased accordingly. The Ćuk converter is described, for example, in U.S. Pat. Nos. 4,184,197; 4,186,437; 4,257,087; and 4,274,133; all of which are hereby incorporated by reference.

The isolated SEPIC converter topology, shown in FIG. 2E, has been proposed as another approach to ripple cancellation. However, this topology has a difficulty with voltage transients, as noted in Dixon, "High Power Factor Preregulator using the SEPIC Converter," 1993 UNITRODE POWER SUPPLY DESIGN SEMINAR at p. 6-1 (publication number SEM-900 from Unitrode), (This book is hereby incorporated by reference.)

General Background

A wide variety of converter topologies have been proposed. See generally Pressman, SWITCHING POWER SUPPLY DESIGN (1991); the 3 volumes of Middlebrook and Ćuk, ADVANCES IN SWITCHED-MODE POWER CONVERSION (2.ed.1983); and all of the annual UNITRODE POWER SUPPLY DESIGN SEMINAR HANDBOOKS; all of which are hereby incorporated by reference. Other references for background in this and related areas include the following: Billings, SWITCHMODE POWER SUPPLY HANDBOOK (1989); Cherry, SWITCHMODE POWER SUPPLY DESIGN (1986); Chryssis, HIGH FREQUENCY SWITCHING POWER SUPPLIES (2.ed. 1989); Flanagan, HANDBOOK OF TRANSFORMER DESIGN & APPLICATIONS (2.ed. 1993); Gottlieb, POWER SUPPLIES, SWITCHING REGULATORS, INVERTERS, AND CONVERTERS (2.ed. 1994); Hoft, SEMICONDUCTOR POWER ELECTRONICS (1986); Lenk, SIMPLIFIED DESIGN OF SWITCHING POWER SUPPLIES (1995); Mazda, POWER ELECTRONICS HANDBOOK (1990); Mohan et al., POWER ELECTRONICS (2.ed. 1995); Nasar, ELECTRIC MACHINES AND TRANSFORMERS (1984); Nave, POWER LINE FILTER DESIGN FOR SWITCHED-MODE POWER SUPPLIES (1991); REACTIVE POWER: BASICS, PROBLEMS AND SOLUTIONS (ed.Sheble 1987); Severns and Bloom, MODERN DC-TO-DC SWITCHMODE POWER CONVERTER CIRCUITS (1984); Shepard, POWER SUPPLIES (1984); Sum, SWITCH MODE POWER CONVERSION (1988); Tihanyi, ELECTROMAGNETIC COMPATIBILITY IN POWER ELECTRONICS (1995); Williams, POWER ELECTRONICS (1987); Wood, SWITCHING POWER CONVERTERS (1981); the proceedings of the annual INTERNATIONAL HIGH-FREQUENCY POWER CONVERSION conferences from 1986 to date; and the proceedings of the POWERCON and POWER ELECTRONICS SPECIALISTS conferences from 1980 to date. All of these books, and the references cited in them, are hereby incorporated by reference.

Innovative Snubber and Ripple Canceller

The present invention provides a fully passive circuit which not only provides dissipationless snubbing, but also achieves nearly complete input ripple cancellation. This is achieved, as shown in FIG. 3A, by adding an additional winding to the isolating transformer. Thus, a second transformer is not needed.

The configuration of the secondary is conventional (in this sample embodiment), and the switching transistor is connected in series with the primary winding across DC inputs (taken e.g. from a full-wave-rectified line voltage). The additional winding is connected on the primary side, and has approximately a near-unity turns ratio with the primary which is the inverse of the coupling coefficient. However, the additional winding is not connected between the two DC inputs, but instead has one end coupled through an intermediate capacitor to the corresponding end of the primary, and the other end coupled through a capacitor to the negative DC input. A clamping element (a recirculation diode, in this example) allows charge flow to maintain proper balance of Volt-seconds on the inductors and amp-seconds on the capacitors. (No current flows through this diode in the steady state.)

When the switch is turned on, the current through the switch increases (as with conventional flyback converters), and when the switch is turned off the energy stored in this current ramp appears as a current at the secondary, which passes through the output diode to charge an output capacitor. However, this circuit differs greatly from a conventional flyback converter in that a balancing current is maintained in the additional winding, which keeps the total current through the primary flat. (The current-steering effects discussed above route the AC component of current into the additional winding rather than the primary winding.) The intermediate capacitor which links the primary and additional windings also provides efficient snubbing: it catches the energy stored in the primary leakage inductance, and also limits the maximum voltage on the switch. This results in a converter with no ripple at the input, high efficiency, and very efficient snubbing.

Specifically, the circuit is configured so that, when the main switch is turned on, the primary and additional windings see the same voltage. Therefore, by selecting the turns ratio to substantially satisfy the relation nk=1 (or alternatively the relation n=k), the ripple can be forced to be zero on the primary winding.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1A:
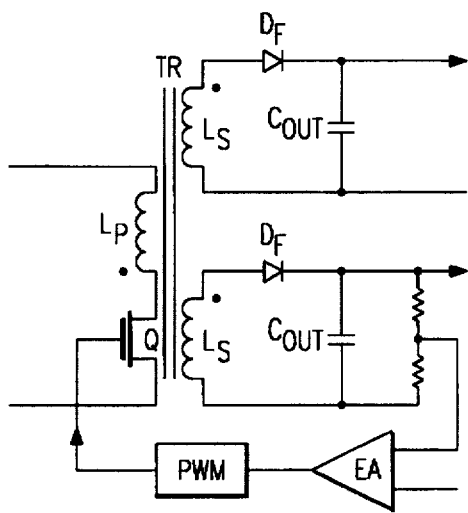
FIG. 1A shows a conventional flyback converter.
Figure 1B:
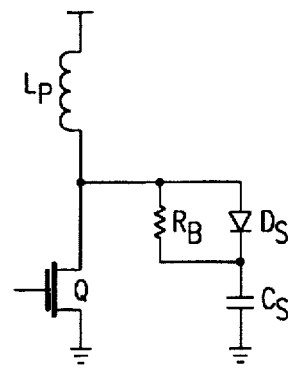
FIG. 1B shows a conventional RCD snubber circuit.
Figure 1C:
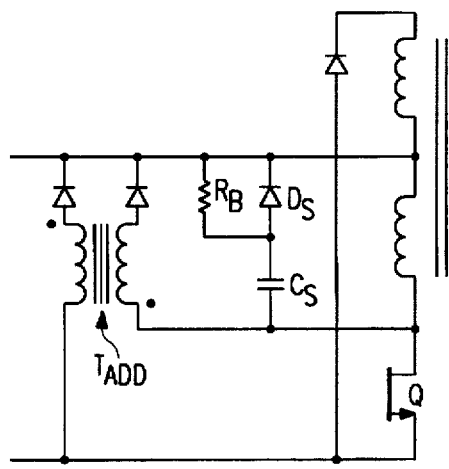
FIG. 1C shows a partially non-dissipative snubber circuit, which uses a transformer in addition to an RCD snubber.
Figure 2A:
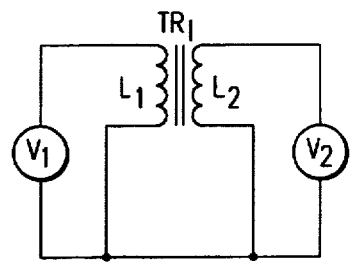
FIG. 2A shows a simple transformer.
Figure 2B:
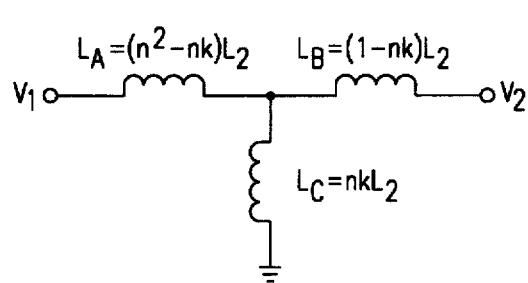
FIG. 2B shows an equivalent circuit model.
Figure 2C:
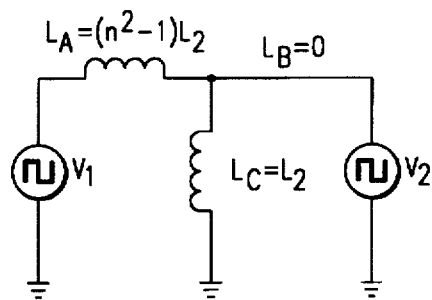
FIG. 2C shows a reduced version of the circuit model of FIG. 2B, which is valid under the special condition that nk=1.
Figure 2D:
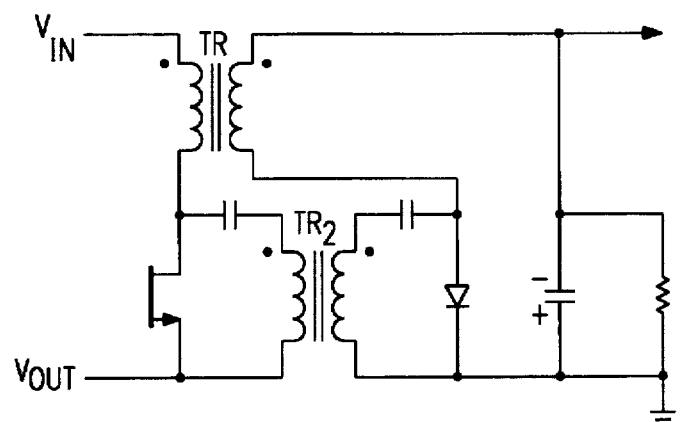
FIG. 2D shows an isolated Ćuk converter.
Figure 2E:
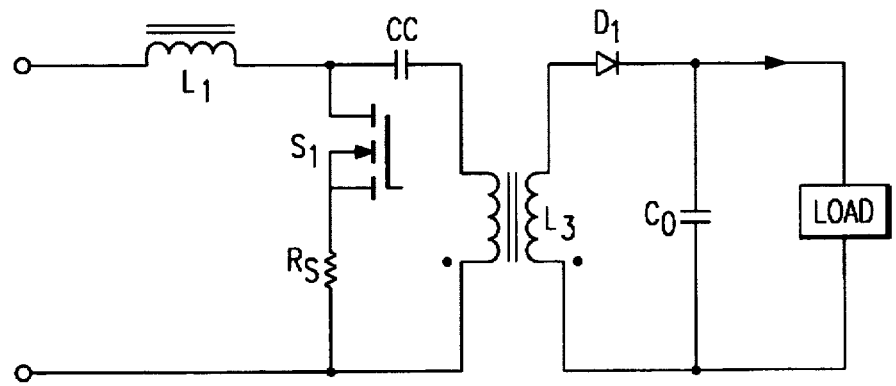
FIG. 2E shows an isolated SEPIC converter topology.
Figure 3A:
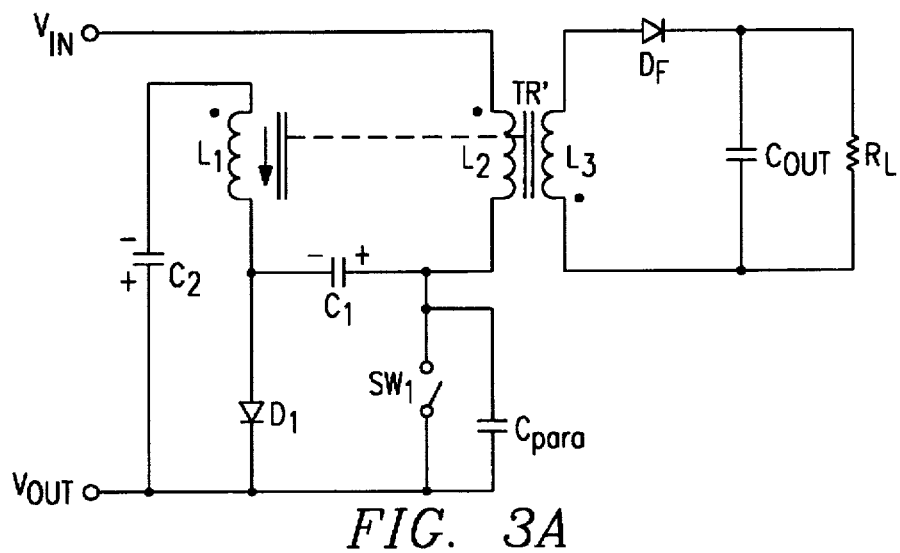
FIG. 3A shows a circuit diagram of a first sample embodiment of the innovative converter.

The numerous innovative teachings of the present application will be described with particular reference to the presently preferred embodiment (by way of example, and not of limitation), in which:

FIG. 3A shows a circuit diagram of a sample embodiment of the disclosed invention. In this embodiment a DC input ($V_{IN}$ and primary-side ground $V_0$) is taken e.g. from a full-wave rectifier which is connected to power mains. For operation from a 120V AC line $V_{in}$ will be about 170V, or about 380V for operation from a 240V AC line. Depending on the amount of filtering used at the rectifier, some hum (at harmonics of the power-line frequency) will normally be present. Power-factor correction, if desired, can be introduced upstream of the circuit of FIG. 3A.

Specific implementation parameters will now be given for a sample embodiment, where:

the nominal input voltage $V_{in}$ is 170V (i.e. taken from a 120V AC power line);

only one secondary winding $L_3$ is used, to provide 3 A of 12V filtered DC output; and the switching frequency is 100 KHz.

A switch SW1 and a transformer primary winding $L_2$ are connected between the positive input $V_{in}$ and primary-side ground. The switch SW1 is preferably an N-channel VDMOS (which includes a body diode). The switch's parasitic capacitance $C_{para}$ is explicitly shown in this Figure.

The transformer TR' is preferably a small ferrite-core unit, e.g. custom wound on a EFD25 core from Magnetics Inc. The turns ratio, to achieve a peak voltage of e.g. 17V on the secondary winding $L_3$, would be about 10:1. (The actual ratio between peak voltage on the secondary and filtered output voltage is related to the design question of what output filter configuration to use; the output filter shown is simply a capacitor $C_{out}$, but output filters may be more complex than that shown.) An additional winding $L_1$ has a ratio of close to unity with the primary, so the complete ratios, in this example, are 10:10:1 (or more generally n:n:1). (Of course, this ratio should approximate the nk=1 or n=k conditions discussed above.)

An intermediate capacitor $C_1$ connects corresponding (undotted) ends of the primary and additional windings. This intermediate capacitor, in the presently preferred embodiment, has a value of about 1 µF and is rated for at least 500V. Since a substantial amount of current is passed through capacitor, a capacitor with low parasitic resistance, i.e. high AC current rating, is preferable. In the presently preferred embodiment, this capacitor is implemented as a multilayer ceramic capacitor.

An additional capacitor $C_2$ connects the dotted end of the additional winding back to primary-side ground. This intermediate capacitor, in the presently preferred embodiment, has a value of about 1 µF and is rated for at least 50V. These component values can of course be varied, but preferably the values of $C_2$, $L_1$, and $C_1$ are selected so that the time constant of the $C_2 L_1 C_1$ combination is substantially longer than the period of oscillation of the converter.

A diode $D_1$ is a clamping element which connects the undotted end of the additional winding back to primary-side ground. This diode allows charge flow to maintain proper balance of Volt-seconds on the inductors and amp-seconds on the capacitors. This diode can be thought of as a passive switch, opposite in polarity to SW1.

Note that the ripple-cancelling and snubbing portion of this circuit is a non-dissipative and all-passive circuit.

Figure 3B:
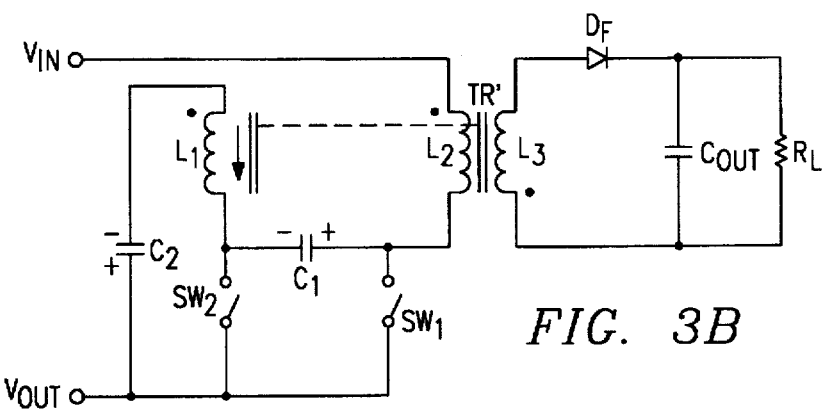
FIG. 3B shows a circuit diagram of a second sample embodiment of the innovative converter.

FIG. 3B shows a second circuit embodiment, which includes a small but significant modification of the embodiment of FIG. 3A. In this embodiment the diode D1 has been replaced by an additional switch SW2. This switch can be used to emulate the operation of diode D1, but it is more preferably used to implement improved operation as described below.

Figure 3D:
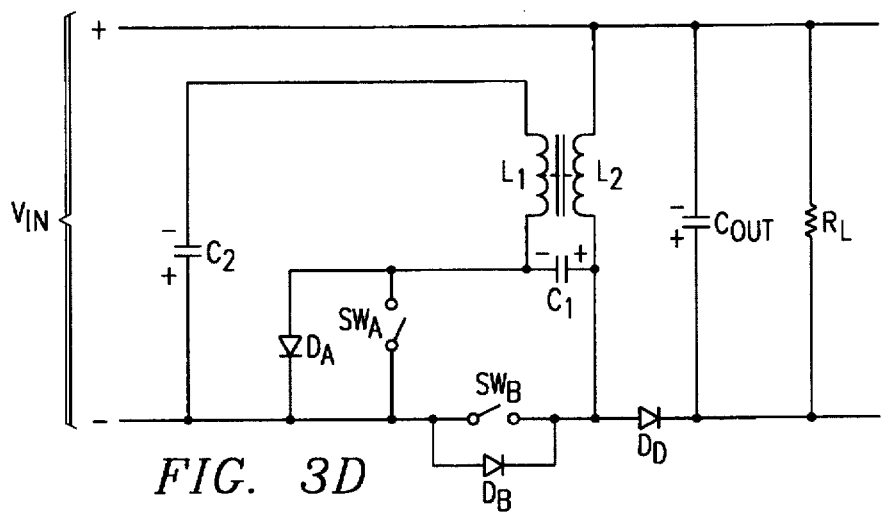
FIG. 3D shows a circuit diagram of a non-isolated sample embodiment of the innovative converter.
Figure 3C:
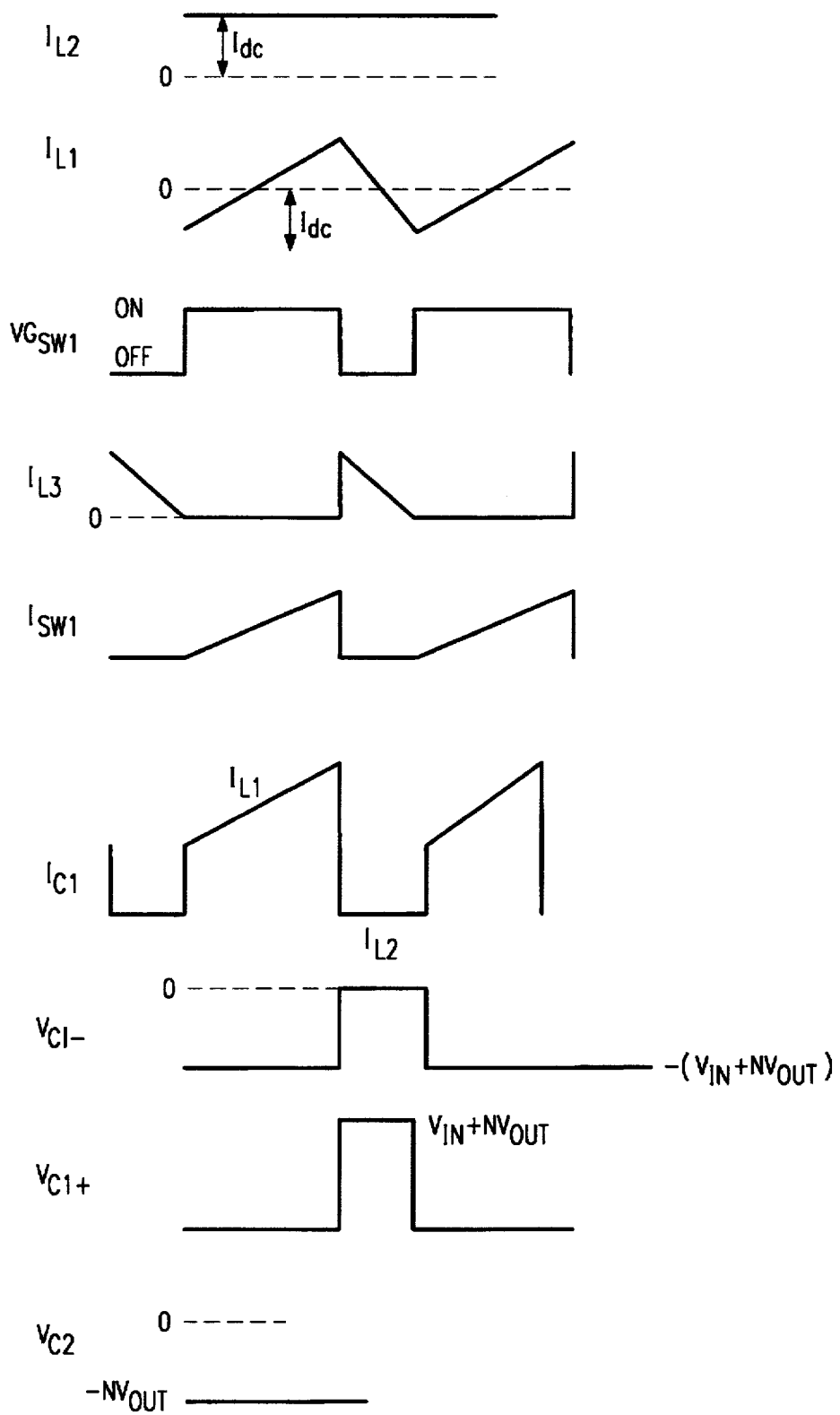
FIG. 3C is a time domain plot of voltages and currents appearing at various points in the circuit diagram of FIG. 3A.

FIG. 3C is a time domain plot of voltages and currents appearing at various points in the circuit diagram of FIG.

3A: The first line of FIG. 3C shows the current $I_{L2}$ across primary winding $L_2$. This is the input current: note that this is absolutely flat. This is a surprising advantage of the disclosed circuit. The reason for this ripple-free input will be seen from the following explanation.

The second line of FIG. 3C shows the current $I_{L1}$ across additional winding $L_1$.

The third line of FIG. 3C shows the gate voltage $VG_{SW1}$ applied to switching transistor SW1.

The fourth line of FIG. 3C shows current $I_{L3}$ in the secondary winding $L_3$. Note that this pops up to a positive value when the switch turns off, and then ramps back down to zero.

The fifth line of FIG. 3C shows current $I_{SW1}$ through the switch SW1.

The sixth line of FIG. 3C shows the current $I_{C1}$ coupled through capacitor C. Note that this ramps up when the current through the switch (and the additional winding $L_1$) is ramping up, but goes to constant negative value when discharge through the secondary is occurring.

The seventh line of FIG. 3C shows the voltage on the – end of capacitor $C_1$. Note that this pops up to about zero when the switch is closed, but otherwise stays at a constant negative value (about $-(V_{in}+nV_{out})$).

The eighth line of FIG. 3C shows the voltage on the + end of capacitor $C_1$.

The ninth line of FIG. 3C shows the voltage on capacitor $C_2$.

Note that this stays negative, at about $-nV_{out}$.

During operation $C_1$ will be charged to $V_{in}+nV_{OUT}$. This results when the SW1 is on and SW2 is off, so that current flows in the secondary. This clamps the secondary winding to the output voltage, and therefore the voltage on the primary windings ($L_1$ and $L_2$) will be $nV_{OUT}$ (More precisely, $C_1$ will be charged to $V_{in}+nV_{OUT}$, and $C_2$ will be charged to $nV_{OUT}$.) During the remaining operation, current is controlled and balanced by $L_1$ and $L_2$, such that $C_1$ and $C_2$ will remain at these values. In addition, $C_1$ and $C_2$ are preferably large enough that their voltages remain approximately constant over the switching cycle.

When SW1 is closed and SW2 open, $L_1$ and $L_2$ both have $V_{in}$ across them. When SW1 is open and SW2 is closed, $L_1$ and $L_2$ both have $nV_{OUT}$ across them. We therefore have the conditions required to steer the ripple to completely reside only on $L_2$, by constructing the transformer such that nk=1 as between $L_1$ and $L_2$.

Thus when SW1 is closed and $L_1$ and $L_2$ each carry $V_{in}$, only $L_1$ will display the characteristic ramp in current $$\left( \frac{di}{dt} = \frac{V_{IN}}{L_1} \right),$$

while the current on $L_2$ will always be a DC value.

As noted above, FIG. 3B permits an improved mode of operation. By allowing SW2 to remain on for a short time after the secondary diode turns off, the current on $L_1$ will continue to become more negative. If SW2 is now opened while SW1 remains off, this additional negative current will pull the charge off SW1, thus advantageously allowing zero-voltage switching.

In this embodiment, the timing of the switch drive signal SW1 is preferably controlled to turn back on immediately when the current across $L_1$ hits its minimum; but these two times do not have to coincide exactly.

FIG. 3D shows a circuit diagram of a non-isolated sample embodiment of the innovative converter. This embodiment is less preferred (since it is not isolated), but it does provide an example of how the innovative ripple-steering circuit can be modified. In this embodiment windings $L_1$ and $L_2$ are inductively coupled as described above (with n=k or n=1/k), and through capacitor $C_1$, and ripple is accordingly steered into $L_1$. In this embodiment the polarity of the secondary is reversed, and switching transistor $SW_B$ is accordingly located between the negative side of the input and an output isolation diode $D_D$.

A particular advantage of this innovative circuit topology is that the DC and AC components of input are completely separated (under steady-state conditions): in the sample embodiment of FIG. 3A, $L_1$ carries only ripple (AC) current, and $L_2$ carries only DC current. This is unlike the Cuk topology, where both inductors see a DC component of current. Since the DC component of current changes with load, the magnetic elements used in the Cuk topology must be sized to avoid saturation under peak load conditions. By contrast, in the innovative topologies provided by the present application, the but current through $L_1$ does not vary with load, and therefore the winding area can be reduced to handle only the flux required by the ripple current.

Figure 4:
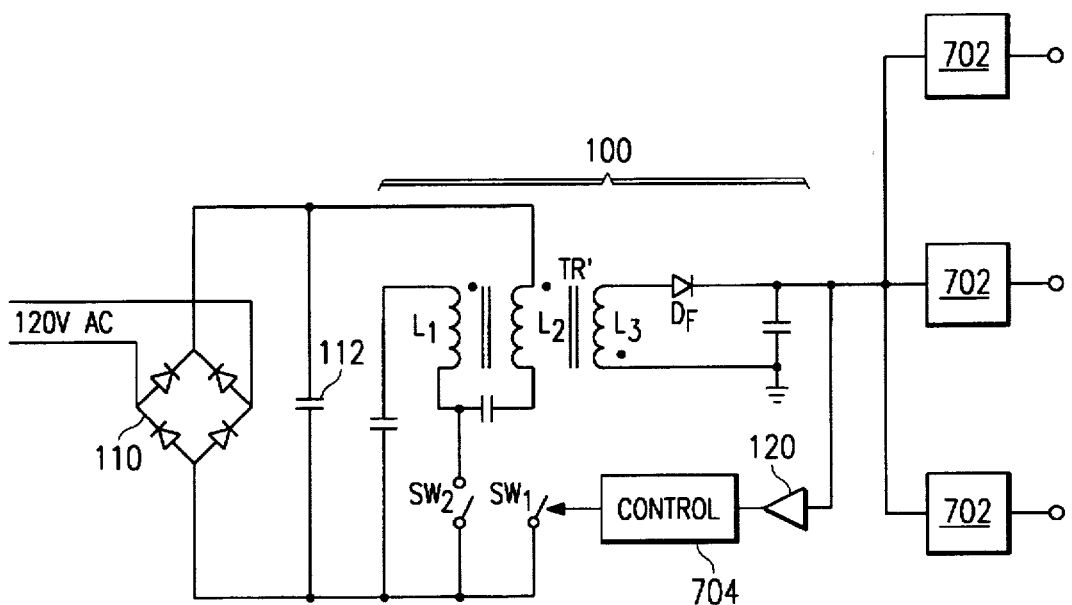
FIG. 4 shows a more complete power supply implementation, which includes a converter as in FIG. 3B together with other stages.

FIG. 4 shows a more complete power supply implementation, which includes a converter 100 as in FIG. 3B together with other stages. In this embodiment a bridge rectifier 110 and input capacitor 112 are used, as well as a voltage regulator 120 on the output (which provides feedback to the primary switch control circuit 704). Note also that multiple secondary stages 702 are used, in this embodiment, to provide multiple independent outputs.

Figure 5:
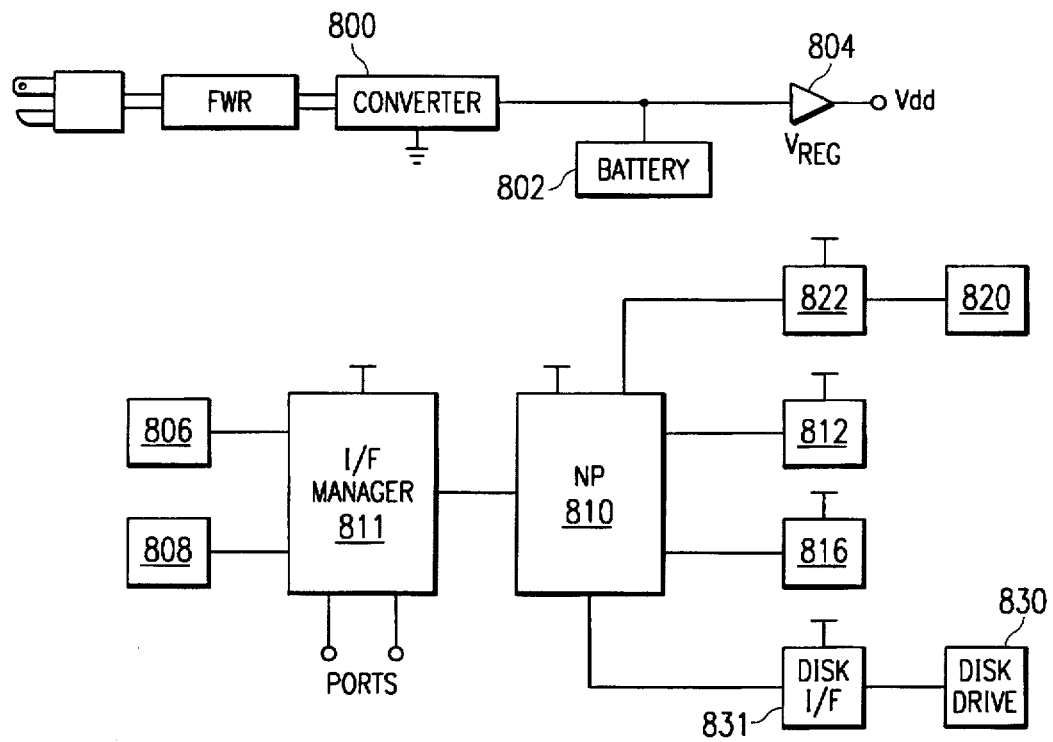
FIG. 5 shows a portable computer including a power supply as in FIG. 4.

FIG. 5 shows a portable computer including a power converter 800 as in FIG. 4, which is used to charge the battery 802. The power converter is connected, through a full-wave bridge rectifier FWR, to draw power from AC mains, and is connected to provide a DC voltage to the battery. The battery 802 (or the converter 800), connected through a voltage regulator 804, is able to power the complete portable computer system, which includes in this example:

user input devices (e.g. keyboard 806 and mouse 808);

at least one microprocessor 810 which is operatively connected to receive inputs from said input device, through an interface manager chip 811 (which also provides an interface to the various ports);

a memory (e.g. flash memory 812 and RAM 816), which is accessible by the microprocessor;

a data output device (e.g. display 820 and display driver card 822) which is connected to output data generated by microprocessor; and a magnetic disk drive 830 which is read-write accessible, through an interface unit 831, by the microprocessor.

Optionally, of course, many other components can be included, and this configuration is not definitive by any means.

Figure 6:
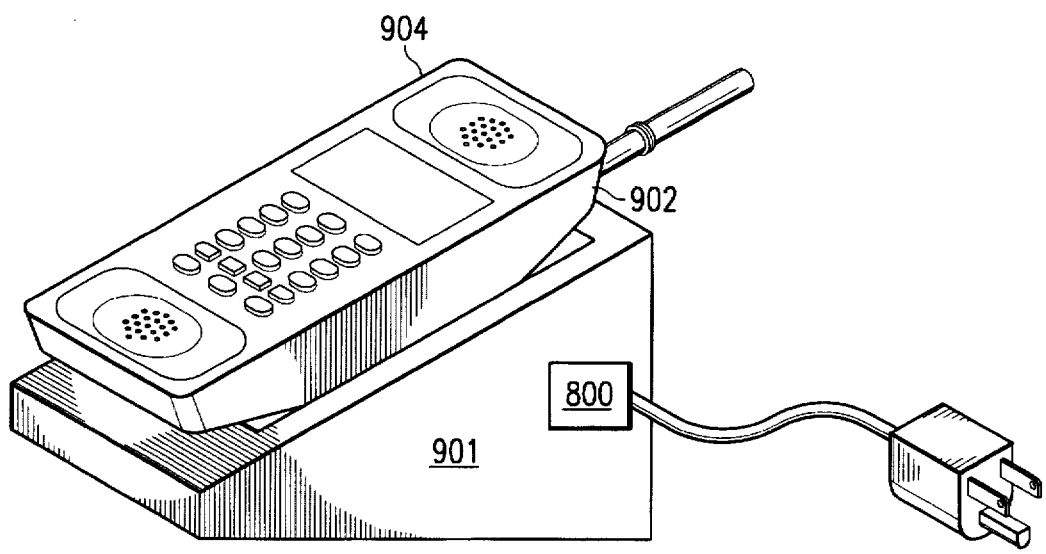
FIG. 6 shows a stand-alone battery charger including a power supply as in FIG. 4.

FIG. 6 shows a stand-alone battery charger, including a power converter 800 as in FIG. 4, which is used to charge the battery 902 of a mobile telephone 904 which is placed in the rack. However, of course the power conversion circuitry can be integrated with the mobile telephone, or with other portable electronics, or can be used with other portable electronics.

According to a disclosed class of innovative embodiments, there is provided: A power converter circuit, comprising: a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between said first ends of said primary and additional windings; a clamping element connected to define a DC bias voltage of said additional winding; an output capacitor having a first terminal operatively connected to a first terminal of said secondary winding, and a second terminal operatively connected to a second terminal of said secondary winding through an output rectification element; whereby when said switch is switched repeatedly, said output capacitor provides an isolated output voltage, and essentially no ripple appears on said primary winding.

According to another disclosed class of innovative embodiments, there is provided: A power converter circuit, comprising: a transformer having primary, secondary, and additional windings; said primary winding having an apparent turns ratio to said additional winding which is approximately equal either to the the coupling coefficient therebetween or else to the inverse of said coupling coefficient; a first switch connected, in series with said primary winding, between first and second power input connections; an intermediate capacitor connected between corresponding first ends of said primary and additional windings; an additional capacitor connected between a second end of said additional winding and said second power input connection; a second switch connected between said additional winding and one of said power input connections; an output capacitor having a first terminal operatively connected to a first terminal of said secondary winding, and a second terminal operatively connected to a second terminal of said secondary winding through an output rectification element; whereby when said first switch is switched repeatedly, said output capacitor provides an isolated output voltage, and essentially no ripple appears on said primary winding; and whereby the relative turn-on timings of said first and second switches can be adjusted to determine the voltage across said first switch at the time when said first switch is turned on.

According to another disclosed class of innovative embodiments, there is provided: A power converter circuit, comprising: a transformer having primary, secondary, and additional windings; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between corresponding first ends of said primary and additional windings; an additional capacitor connected between a second end of said additional winding and said second power input connection; a clamping element connected to define a DC bias voltage of said additional winding; an output capacitor having a first terminal operatively connected to a first terminal of said secondary winding, and a second terminal operatively connected to a second terminal of said secondary winding through an output rectification element; whereby when said switch is switched repeatedly, said output capacitor provides an isolated output voltage, and essentially no ripple appears on said primary winding.

According to another disclosed class of innovative embodiments, there is provided: A power supply subsystem, comprising: a full-wave rectifier subcircuit which is connected to receive an AC power line voltage, and to generate a full-wave-rectified voltage therefrom on a pair of DC supply lines; an input capacitor connected across said DC supply lines; an isolated power conversion circuit which is connected to receive said DC supply lines as supply voltage inputs, and which includes a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between said first ends of said primary and additional windings; a clamping element connected to define a DC bias voltage of said additional winding; an output capacitor having a first and second terminals operatively connected to first and second terminals of said secondary winding, through a connection which includes at least one output rectification element; and an output filter connected to smooth the output of said power conversion circuit; whereby when said switch is switched repeatedly, said output capacitor provides an isolated output voltage, and essentially no ripple appears on said primary winding.

According to another disclosed class of innovative embodiments, there is provided: A power supply subsystem, comprising: a full-wave rectifier subcircuit which is connected to receive an AC power line voltage, and to generate a full-wave-rectified voltage therefrom on a pair of DC supply lines; an input capacitor connected across said DC supply lines; an isolated power conversion circuit which is connected to receive said DC supply lines as supply voltage inputs, and which includes a transformer having primary, secondary, and additional windings; said primary winding having an apparent turns ratio to said additional winding which is approximately equal either to the the coupling coefficient therebetween or else to the inverse of said coupling coefficient; a first switch connected, in series with said primary winding, between first and second power input connections; an intermediate capacitor connected between corresponding first ends of said primary and additional windings; an additional capacitor connected between a second end of said additional winding and said second power input connection; a second switch connected between said additional winding and one of said power input connections; an output capacitor having a first terminal operatively connected to a first terminal of said secondary winding, and a second terminal operatively connected to a second terminal of said secondary winding through an output rectification element; and an output filter connected to smooth the output of said power conversion circuit; whereby essentially no ripple appears on said primary winding; and whereby energy dissipated in said first switch at turn-on can be minimized by adjustment of the relative timings of said first and second switches.

According to another disclosed class of innovative embodiments, there is provided: A power supply subsystem, comprising: a full-wave rectifier subcircuit which is connected to receive an AC power line voltage, and to generate a full-wave-rectified voltage therefrom on a pair of DC supply lines; an input capacitor connected across said DC supply lines; an isolated power conversion circuit which is connected to receive said DC supply lines as supply voltage inputs, and which includes a transformer having primary, secondary, and additional windings; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between corresponding first ends of said primary and additional windings, and an additional capacitor connected between a second end of said additional winding and said second power input connection, and a clamping element connected to define a DC bias voltage of said additional winding; whereby essentially no ripple current appears on said primary winding; an output capacitor having a first terminal operatively connected to a first terminal of said secondary winding, and a second terminal operatively connected to a second terminal of said secondary winding through an output rectification element; and an output filter connected to smooth the output of said power conversion circuit.

According to another disclosed class of innovative embodiments, there is provided: A computer system, comprising: a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises: a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between said first ends of said primary and additional windings; a clamping element connected to define a DC bias voltage of said additional winding; an output capacitor having a first terminal operatively connected to a first terminal of said secondary winding, and a second terminal operatively connected to a second terminal of said secondary winding through an output rectification element; whereby when said switch is switched repeatedly, said output capacitor provides an isolated output voltage, and essentially no ripple appears on said primary winding.

According to another disclosed class of innovative embodiments, there is provided: A computer system, comprising: a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises: a transformer having primary, secondary, and additional windings; said primary winding having an apparent turns ratio to said additional winding which is approximately equal either to the the coupling coefficient therebetween or else to the inverse of said coupling coefficient; a first switch connected, in series with said primary winding, between first and second power input connections; an intermediate capacitor connected between corresponding first ends of said primary and additional windings; an additional capacitor connected between a second end of said additional winding and said second power input connection; a second switch connected between said additional winding and one of said power input connections; an output capacitor having a first terminal operatively connected to a first terminal of said secondary winding, and a second terminal operatively connected to a second terminal of said secondary winding through an output rectification element; whereby energy dissipated in said first switch at turn-on can be minimized by adjustment of the relative timings of said first and second switches, and whereby electromagnetic noise in said computer system is reduced by removing ripple current from said primary winding.

According to another disclosed class of innovative embodiments, there is provided: A computer system, comprising: a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises: a transformer having primary, secondary, and additional windings; said primary winding having an apparent turns ratio to said additional winding which is approximately equal either to the the coupling coefficient therebetween or else to the inverse of said coupling coefficient; a controllable switch connected, in series with said primary winding, between first and second power input connections; an intermediate capacitor connected between corresponding first ends of said primary and additional windings; an additional capacitor connected between a second end of said additional winding and said second power input connection; a clamping element connected to define a DC bias voltage of said additional winding; an output capacitor having a first terminal operatively connected to a first terminal of said secondary winding, and a second terminal operatively connected to a second terminal of said secondary winding through an output rectification element; whereby when said switch is switched repeatedly, said output capacitor provides an isolated output voltage, and essentially no ripple appears on said primary winding; and whereby electromagnetic noise in said computer system is reduced.

According to another disclosed class of innovative embodiments, there is provided: A power conversion method, comprising the steps of: applying power, through first and second power input connections, to the series combination of a switching transistor with a primary winding of a transformer which also includes secondary and additional windings all inductively coupled together; and repeatedly switching said transistor off and on; at the time when said transistor is switched on, initially diverting most of the current from said primary winding into a first terminal of an intermediate capacitor; said intermediate capacitor being connected between said primary winding and an additional winding which is and thereafter ramping the current applied to a second terminal of said intermediate capacitor from said additional winding, and correspondingly ramping the current passed by said switch; whereby said primary winding increasingly drives current through said switch rather than said intermediate capacitor; and at the time when said transistor is switched off, drawing current from a secondary transformer winding which is inductively coupled to said primary winding; and reversing the direction of change of current on said additional winding, to recycle charge on said intermediate capacitor; whereby current through said primary winding remains substantially constant.

According to another disclosed class of innovative embodiments, there is provided: A power conversion method, comprising the steps of: repeatedly turning on a switch, which is connected in series with a primary winding of a transformer which also includes secondary and additional windings all inductively coupled together, and ramping up current through switch, and correspondingly ramping current through said additional winding while leaving the current through said primary winding substantially unchanged; and turning off said switch, to initiate a current in said secondary winding, and correspondingly ramping current through said additional winding while leaving the current through said primary winding substantially unchanged; wherein said first and additional windings are coupled, at first ends thereof, through an intermediate capacitor; and wherein said additional winding is not interposed in any DC current path from said switch or said primary winding to any power supply connection.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. In general, statements made in the specification of the present application do not necessarily delimit any of the various claimed inventions. Moreover, some statements may apply to some inventive features but not to others.

As will be obvious to those of ordinary skill in the art, other circuit elements can be added to, or substituted into, the specific circuit topologies shown.

For example, some imprecision in the relation between the turns ratio and the coupling coefficient can be tolerated: it is most preferable that nk=1 (or n=k), but values near this can still provide some ripple reduction (as long as the AC voltage is not steered to the wrong inductor).

For one example, the diode D1 on the input side can optionally and less preferably be referenced to a different fixed potential (such as Vin), and/or can be relocated (e.g. to the plus side of $C_2$).

For another example, while the input and/or output filters have generally been shown as very simple one-stage circuits, it is of course possible to use a wide range of input and output filter implementations, as is well known to those of ordinary skill in the art.

For another example, the present invention can optionally be combined with a wide range of regulator control loop configurations, as is well known to those of ordinary skill in the art.

For another example, while the presently preferred embodiment has been described with reference to FET switching devices, the described innovations can also be adapted to circuits which use IGBTs, MCTs, bipolars, or other active devices for switching.

What is claimed is:

1. A power converter circuit, comprising:
    a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient;
    a controllable switch connected, in series with said primary winding, between first and second power input connections;
    an intermediate capacitor connected between said first ends of said primary and additional windings;
    a clamping element connected to provide a current connection to said additional winding, under at least some conditions;
    an output capacitor having a first terminal operatively connected to a first terminal of said secondary winding, and a second terminal operatively connected to a second terminal of said secondary winding through an output rectification element;
    whereby when said switch is switched repeatedly, said output capacitor provides an isolated output voltage, and essentially no ripple appears on said primary winding.

2. The circuit of claim 1, further comprising an additional capacitor connected between said second end of said additional winding and said second power input connection.

3. The circuit of claim 1, wherein said switch is an N-channel DMOS transistor.

4. The circuit of claim 1, wherein said clamping element consists of a single diode.

5. The circuit of claim 1, wherein said primary and additional windings have a near-unity coupling coefficient therebetween.

6. The circuit of claim 1, wherein said clamping element is connected between said first end of said additional winding and said second power input connection.

7. The circuit of claim 1, wherein said output rectification element consists of a single diode.

8. The circuit of claim 1, further comprising a bridge rectifier which is connected to be driven by an AC power line, and which provides a rectified voltage to said first and second power input connections, and further comprising an input capacitor connected across said first and second power input connections.

9. A power converter circuit, comprising:
    a transformer having primary, secondary, and additional windings; said primary winding having an apparent turns ratio to said additional winding which is approximately equal either to the the coupling coefficient therebetween or else to the inverse of said coupling coefficient;
    a first switch connected, in series with said primary winding, between first and second power input connections;
    an intermediate capacitor connected between corresponding first ends of said primary and additional windings;
    an additional capacitor connected between a second end of said additional winding and said second power input connection;
    a second switch connected between said additional winding and one of said power input connections;
    an output capacitor having a first terminal operatively connected to a first terminal of said secondary winding, and a second terminal operatively connected to a second terminal of said secondary winding through an output rectification element;
    whereby when said first switch is switched repeatedly, said output capacitor provides an isolated output voltage, and essentially no ripple appears on said primary winding;
    and whereby the relative turn-on timings of said first and second switches can be adjusted to determine the voltage across said first switch at the time when said first switch is turned on.

10. The circuit of claim 9, wherein said second switch is connected between said additional winding and said second power input connection.

11. The circuit of claim 9, wherein said second switch is connected between said first end of said additional winding and said second power input connection.

12. The circuit of claim 9, further comprising an additional capacitor connected between said second end of said additional winding and said second power input connection.

13. The circuit of claim 9, wherein said first switch is an N-channel DMOS transistor.

14. The circuit of claim 9, wherein said second switch is an N-channel DMOS transistor.

15. The circuit of claim 9, wherein said output rectification element consists of a single diode.

16. The circuit of claim 9, further comprising a bridge rectifier which is connected to be driven by an AC power line, and which provides a rectified voltage to said first and second power input connections, and further comprising an input capacitor connected across said first and second power input connections.

17. A power converter circuit, comprising:
a transformer having primary, secondary, and additional windings, said primary winding having an apparent turns ratio to said additional winding which is approximately equal either to the the coupling coefficient therebetween or else to the inverse of said coupling coefficient;
a controllable switch connected, in series with said primary winding, between first and second power input connections;
an intermediate capacitor connected between corresponding first ends of said primary and additional windings;
an additional capacitor connected between a second end of said additional winding and said second power input connection;
a clamping element connected to provide a current connection to said additional winding, under at least some conditions;
an output capacitor having a first terminal operatively connected to a first terminal of said secondary winding, and a second terminal operatively connected to a second terminal of said secondary winding through an output rectification element;
whereby when said switch is switched repeatedly, said output capacitor provides an isolated output voltage, and essentially no ripple appears on said primary winding.

18. The circuit of claim 17, further comprising an additional capacitor connected between said second end of said additional winding and said second power input connection.

19. The circuit of claim 17, wherein said switch is an N-channel DMOS transistor.

20. The circuit of claim 17, wherein said clamping element consists of a single diode.

21. The circuit of claim 17, wherein said clamping element is connected between said first end of said additional winding and said second power input connection.

22. The circuit of claim 17, wherein said output rectification element consists of a single diode.

23. The circuit of claim 17, further comprising a bridge rectifier which is connected to be driven by an AC power line, and which provides a rectified voltage to said first and second power input connections, and further comprising an input capacitor connected across said first and second power input connections.

24. A power supply subsystem, comprising:
a full-wave rectifier subcircuit which is connected to receive an AC power line voltage, and to generate a full-wave-rectified voltage therefrom on a pair of DC supply lines;
an input capacitor connected across said DC supply lines;
an isolated power conversion circuit which is connected to receive said DC supply lines as supply voltage inputs, and which includes
a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient;
a controllable switch connected, in series with said primary winding, between first and second power input connections;
an intermediate capacitor connected between said first ends of said primary and additional windings;
a clamping element connected to provide a current connection to said additional winding, under at least some conditions;
an output capacitor having a first and second terminals operatively connected to first and second terminals of said secondary winding, through a connection which includes at least one output rectification element; and
an output filter connected to smooth the output of said power conversion circuit;
whereby when said switch is switched repeatedly, said output capacitor provides an isolated output voltage, and essentially no ripple appears on said primary winding.

25. The subsystem of claim 24, wherein said second switch is connected between said additional winding and said second power input connection.

26. The subsystem of claim 24, wherein said second switch is connected between said first end of said additional winding and said second power input connection.

27. The subsystem of claim 24, further comprising an additional capacitor connected between said second end of said additional winding and said second power input connection.

28. The subsystem of claim 24, wherein said output rectification element consists of a single diode.

29. The subsystem of claim 24, further comprising a bridge rectifier which is connected to be driven by an AC power line, and which provides a rectified voltage to said first and second power input connections, and further comprising an input capacitor connected across said first and second power input connections.

30. A power supply subsystem, comprising:
a full-wave rectifier subcircuit which is connected to receive an AC power line voltage, and to generate a full-wave-rectified voltage therefrom on a pair of DC supply lines;
an input capacitor connected across said DC supply lines;
an isolated power conversion circuit which is connected to receive said DC supply lines as supply voltage inputs, and which includes
a transformer having primary, secondary, and additional windings; said primary winding having an apparent turns ratio to said additional winding which is approximately equal either to the the coupling coefficient therebetween or else to the inverse of said coupling coefficient;

a first switch connected, in series with said primary winding, between first and second power input connections;

an intermediate capacitor connected between corresponding first ends of said primary and additional windings;

an additional capacitor connected between a second end of said additional winding and said second power input connection;

a second switch connected between said additional winding and one of said power input connections;

an output capacitor having a first terminal operatively connected to a first terminal of said secondary winding, and a second terminal operatively connected to a second terminal of said secondary winding through an output rectification element;

and an output filter connected to smooth the output of said power conversion circuit;

whereby essentially no ripple appears on said primary winding;

and whereby energy dissipated in said first switch at turn-on can be minimized by adjustment of the relative timings of said first and second switches.

31. The subsystem of claim 30, wherein said second switch is connected between said additional winding and said second power input connection.

32. The subsystem of claim 30, wherein said second switch is connected between said first end of said additional winding and said second power input connection.

33. The subsystem of claim 30, further comprising an additional capacitor connected between said second end of said additional winding and said second power input connection.

34. The subsystem of claim 30, wherein said output rectification element consists of a single diode.

35. The subsystem of claim 30, further comprising a bridge rectifier which is connected to be driven by an AC power line, and which provides a rectified voltage to said first and second power input connections, and further comprising an input capacitor connected across said first and second power input connections.

36. A power supply subsystem, comprising:

a full-wave rectifier subcircuit which is connected to receive an AC power line voltage, and to generate a full-wave-rectified voltage therefrom on a pair of DC supply lines;

an input capacitor connected across said DC supply lines;

an isolated power conversion circuit which is connected to receive said DC supply lines as supply voltage inputs, and which includes a transformer having primary, secondary, and additional windings; said primary winding having an apparent turns ratio to said additional winding which is approximately equal either to the the coupling coefficient therebetween or else to the inverse of said coupling coefficient;

a controllable switch connected, in series with said primary winding, between first and second power input connections;

an intermediate capacitor connected between corresponding first ends of said primary and additional windings, and an additional capacitor connected between a second end of said additional winding and said second power input connection, and a clamping element connected to provide a current connection to said additional winding, under at least some conditions; whereby essentially no ripple current appears on said primary winding;

an output capacitor having a first terminal operatively connected to a first terminal of said secondary winding, and a second terminal operatively connected to a second terminal of said secondary winding through an output rectification element;

and an output filter connected to smooth the output of said power conversion circuit.

37. The subsystem of claim 36, wherein said second switch is connected between said additional winding and said second power input connection.

38. The subsystem of claim 36, wherein said second switch is connected between said first end of said additional winding and said second power input connection.

39. The subsystem of claim 36, further comprising an additional capacitor connected between said second end of said additional winding and said second power input connection.

40. The subsystem of claim 36, wherein said output rectification element consists of a single diode.

41. The subsystem of claim 36, further comprising a bridge rectifier which is connected to be driven by an AC power line, and which provides a rectified voltage to said first and second power input connections, and further comprising an input capacitor connected across said first and second power input connections.

42. A computer system, comprising:

a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises:

a transformer having primary, secondary, and additional windings; said windings each having first and second ends, and being inductively coupled together so that all said respective first ends show mutually corresponding voltage changes; said primary winding having an apparent turns ratio to said additional winding which is approximately equal either to the the coupling coefficient therebetween or else to the inverse of said coupling coefficient;

a controllable switch connected, in series with said primary winding, between first and second power input connections;

an intermediate capacitor connected between said first ends of said primary and additional windings;

a clamping element connected to provide a current connection to said additional winding, under at least some conditions;

an output capacitor having a first terminal operatively connected to a first terminal of said secondary winding, and a second terminal operatively connected to a second terminal of said secondary winding through an output rectification element;

whereby when said switch is switched repeatedly, said output capacitor provides an isolated output voltage, and essentially no ripple appears on said primary winding.

43. The system of claim 42, wherein said second switch is connected between said additional winding and said second power input connection.

44. The system of claim 42, wherein said second switch is connected between said first end of said additional winding and said second power input connection.

45. The system of claim 42, further comprising an additional capacitor connected between said second end of said additional winding and said second power input connection.

46. The system of claim 42, wherein said output rectification element consists of a single diode.

47. The system of claim 42, further comprising a bridge rectifier which is connected to be driven by an AC power line, and which provides a rectified voltage to said first and second power input connections, and further comprising an input capacitor connected across said first and second power input connections.

48. A computer system, comprising:
   a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises:
      a transformer having primary, secondary, and additional windings; said primary winding having an apparent turns ratio to said additional winding which is approximately equal either to the the coupling coefficient therebetween or else to the inverse of said coupling coefficient;
      a first switch connected, in series with said primary winding, between first and second power input connections;
      an intermediate capacitor connected between corresponding first ends of said primary and additional windings;
      an additional capacitor connected between a second end of said additional winding and said second power input connection;
      a second switch connected between said additional winding and one of said power input connections;
      an output capacitor having a first terminal operatively connected to a first terminal of said secondary winding, and a second terminal operatively connected to a second terminal of said secondary winding through an output rectification element;
   whereby energy dissipated in said first switch at turn-on can be minimized by adjustment of the relative timings of said first and second switches, and whereby electromagnetic noise in said computer system is reduced by removing ripple current from said primary winding.

49. The system of claim 48, wherein said second switch is connected between said additional winding and said second power input connection.

50. The system of claim 48, wherein said second switch is connected between said first end of said additional winding and said second power input connection.

51. The system of claim 48, further comprising an additional capacitor connected between said second end of said additional winding and said second power input connection.

52. The system of claim 48, wherein said output rectification element consists of a single diode.

53. The system of claim 48, further comprising a bridge rectifier which is connected to be driven by an AC power line, and which provides a rectified voltage to said first and second power input connections, and further comprising an input capacitor connected across said first and second power input connections.

54. A computer system, comprising:
   a user input device; a microprocessor operatively connected to receive inputs from said input device; memory which is read/write accessible by said microprocessor; a data output device operatively connected to output data generated by said microprocessor; and a power connection for drawing power from AC mains, and a power supply connected to said power connection; wherein said power supply comprises:
      a transformer having primary, secondary, and additional windings; said primary winding having an apparent turns ratio to said additional winding which is approximately equal either to the the coupling coefficient therebetween or else to the inverse of said coupling coefficient;
      a controllable switch connected, in series with said primary winding, between first and second power input connections;
      an intermediate capacitor connected between corresponding first ends of said primary and additional windings;
      an additional capacitor connected between a second end of said additional winding and said second power input connection;
      a clamping element connected to define a DC bias voltage of said additional winding;
      an output capacitor having a first terminal operatively connected to a first terminal of said secondary winding, and a second terminal operatively connected to a second terminal of said secondary winding through an output rectification element;
   whereby when said switch is switched repeatedly, said output capacitor provides an isolated output voltage, and essentially no ripple appears on said primary winding;
   and whereby electromagnetic noise in said computer system is reduced.

55. The system of claim 54, wherein said second switch is connected between said additional winding and said second power input connection.

56. The system of claim 54, wherein said second switch is connected between said first end of said additional winding and said second power input connection.

57. The system of claim 54, further comprising an additional capacitor connected between said second end of said additional winding and said second power input connection.

58. The system of claim 54, wherein said output rectification element consists of a single diode.

59. The system of claim 54, further comprising a bridge rectifier which is connected to be driven by an AC power line, and which provides a rectified voltage to said first and second power input connections, and further comprising an input capacitor connected across said first and second power input connections.

60. A power conversion method, comprising the steps of:
   (a.) applying power, through first and second power input connections, to the series combination of a switching transistor with a primary winding of a transformer which also includes secondary and additional windings all inductively coupled together; and repeatedly switching said transistor off and on;
   (b.) at the time when said transistor is switched on,
      (i.) initially diverting most of the current from said primary winding into a first terminal of an intermediate capacitor; said intermediate capacitor being connected between said primary winding and an additional winding which is (ii.) and thereafter ramping the current applied to a second terminal of said intermediate capacitor from said additional winding, and correspondingly ramping the current passed by said switch; whereby said primary winding increasingly drives current through said switch rather than said intermediate capacitor; and (c.) at the time when said transistor is switched off,
(i.) drawing current from a secondary transformer winding which is inductively coupled to said primary winding;
(ii.) and reversing the direction of change of current on said additional winding, to recycle charge on said intermediate capacitor;

whereby current through said primary winding remains substantially constant.

61. A power conversion method, comprising the steps of:

(a.) repeatedly turning on a switch, which is connected in series with a primary winding of a transformer which also includes secondary and additional windings all inductively coupled together, and ramping up current through switch, and correspondingly ramping current through said additional winding while leaving the current through said primary winding substantially unchanged; and (b.) turning off said switch, to initiate a current in said secondary winding, and correspondingly ramping current through said additional winding while leaving the current through said primary winding substantially unchanged;

wherein said first and additional windings are coupled, at first ends thereof, through an intermediate capacitor;

and wherein said additional winding is not interposed in any DC current path from said switch or said primary winding to any power supply connection.

* * * * *